(12) United States Patent
Jones et al.

(10) Patent No.: US 9,217,827 B2
(45) Date of Patent: Dec. 22, 2015

(54) OPTICAL WAVEGUIDE ARRANGEMENTS COMPRISING AN AUXILIARY WAVEGUIDE-LIKE STRUCTURE

(75) Inventors: Stephen K. Jones, Northampton (GB); Peter J. Williams, East Hunsbury (GB)

(73) Assignee: OCLARO TECHNOLOGY LIMITED, Northamptonshire (GB)

( * ) Notice: Subject to any disclaimer, the term of this patent is extended or adjusted under 35 U.S.C. 154(b) by 195 days.

(21) Appl. No.: 13/884,334

(22) PCT Filed: Nov. 11, 2011

(86) PCT No.: PCT/GB2011/052192
§ 371 (c)(1),
(2), (4) Date: May 9, 2013

(87) PCT Pub. No.: WO2012/072998
PCT Pub. Date: Jun. 7, 2012

(65) Prior Publication Data
US 2013/0223790 A1    Aug. 29, 2013

(30) Foreign Application Priority Data
Dec. 1, 2010 (GB) .................................. 1020351.1

(51) Int. Cl.
G02B 6/136    (2006.01)
G02B 6/28     (2006.01)
G02B 6/122    (2006.01)
(Continued)

(52) U.S. Cl.
CPC ............... *G02B 6/136* (2013.01); *G02B 6/122* (2013.01); *G02B 6/14* (2013.01); *G02B 6/2813* (2013.01); *H01L 21/306* (2013.01); *G02B 6/125* (2013.01); *G02B 2006/12097* (2013.01)

(58) Field of Classification Search
CPC ............................. G02B 6/136; G02B 6/2813
See application file for complete search history.

(56) References Cited

U.S. PATENT DOCUMENTS

| 4,049,944 | A   |   | 9/1977 | Garvin et al. |
|-----------|-----|---|--------|---------------|
| 6,950,581 | B2  | * | 9/2005 | Bandyopadhyay ............. 385/42 |

(Continued)

FOREIGN PATENT DOCUMENTS

| EP | 1873583 A2 | 1/2008 |
|----|------------|--------|
| EP | 2028735 A1 | 2/2009 |

(Continued)

OTHER PUBLICATIONS

PCT International Search Report and Written Opinion, Application No. PCT/GB2011/052192 dated Mar. 7, 2012, 10 pages.

(Continued)

*Primary Examiner* — Rhonda Peace
(74) *Attorney, Agent, or Firm* — Fenwick & West LLP

(57) ABSTRACT

An optical waveguide arrangement is provided which comprises an active ridge waveguide structure 12 formed by etching of a semiconductor substrate 1, 2, 3. There is also provided an auxiliary waveguide-like structure 8 formed on the substrate adjacent the active ridge waveguide structure 12 to control the etched profile of the active waveguide structure. The arrangement of the auxiliary structure 8 on the substrate controls the etched profile over the cross-section of the active waveguide structure 12 and along the length of the active waveguide structure 12. Advantageously, this arrangement reduces or eliminates the disadvantages associated with etch-process induced asymmetries in the shape of closely spaced waveguides.

13 Claims, 14 Drawing Sheets

(51) Int. Cl.
  *G02B 6/14* (2006.01)
  *H01L 21/306* (2006.01)
  *G02B 6/12* (2006.01)
  *G02B 6/125* (2006.01)

(56) References Cited

U.S. PATENT DOCUMENTS

| | | | |
|---|---|---|---|
| 7,116,880 B1* | 10/2006 | Liu et al. | 385/129 |
| 8,644,653 B2* | 2/2014 | Evans | 385/14 |
| 2006/0013551 A1* | 1/2006 | Foresi et al. | 385/129 |
| 2008/0304528 A1 | 12/2008 | Yamamoto et al. | |
| 2012/0051687 A1* | 3/2012 | Evans | 385/14 |
| 2012/0281942 A1* | 11/2012 | Jinnouchi et al. | 385/1 |
| 2013/0223790 A1* | 8/2013 | Jones et al. | 385/14 |

FOREIGN PATENT DOCUMENTS

| | | | |
|---|---|---|---|
| JP | 2007-233294 A | | 9/2007 |
| JP | 2007233294 A | * | 9/2007 |
| WO | WO2010/025264 A1 | | 3/2010 |

OTHER PUBLICATIONS

GB Search Report, Application No. GB1020351.1 dated Mar. 29, 2011, 2 pages.

Hill, Martin T., et al.; Journal of Lightwave Technology, "Optimizing Imbalance and Loss in 2×2 3-dB Multimode Interference Couplers via Access Waveguide Width," vol. 21, No. 10, Oct. 2003, pp. 2305-2313.

* cited by examiner

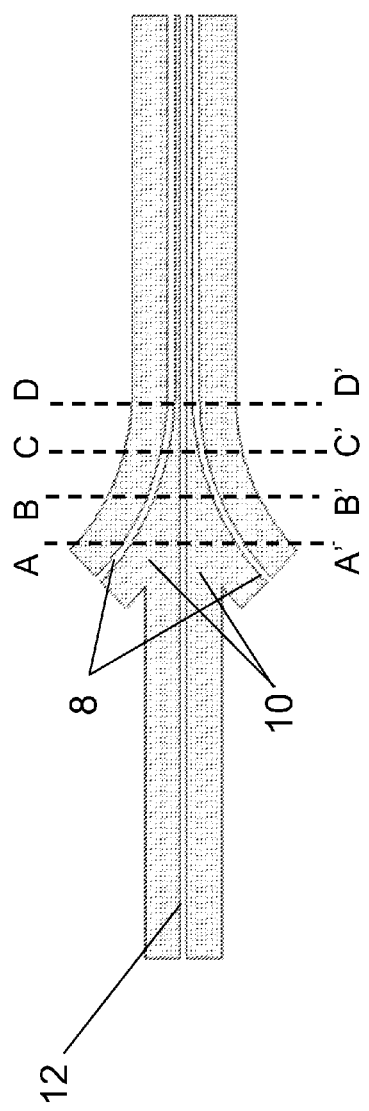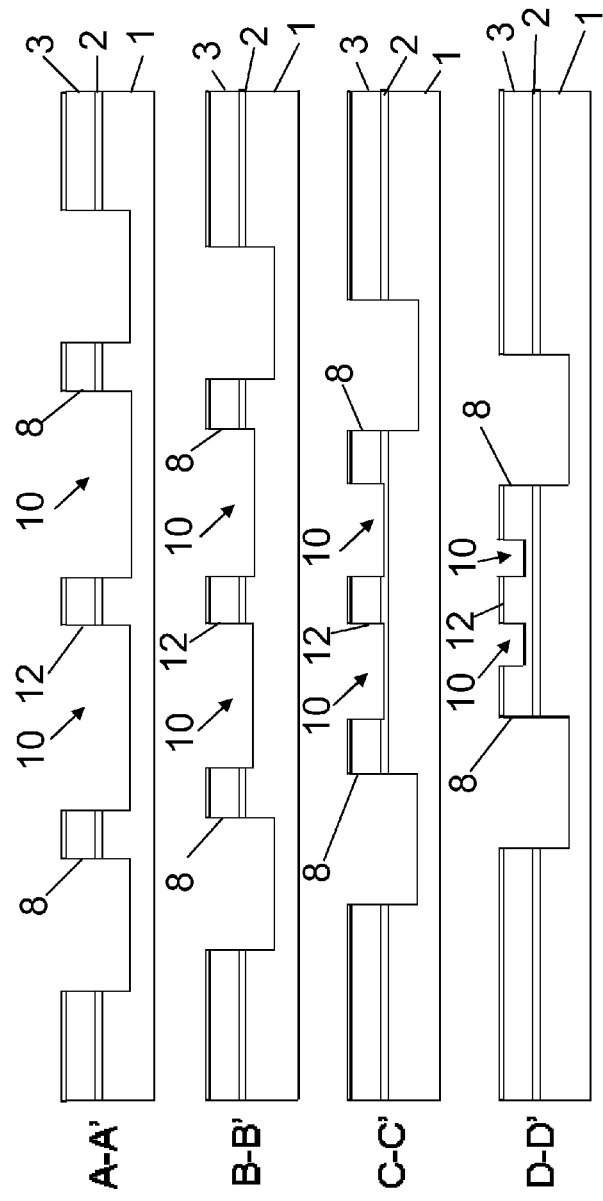
Fig. 8a
Fig. 8b

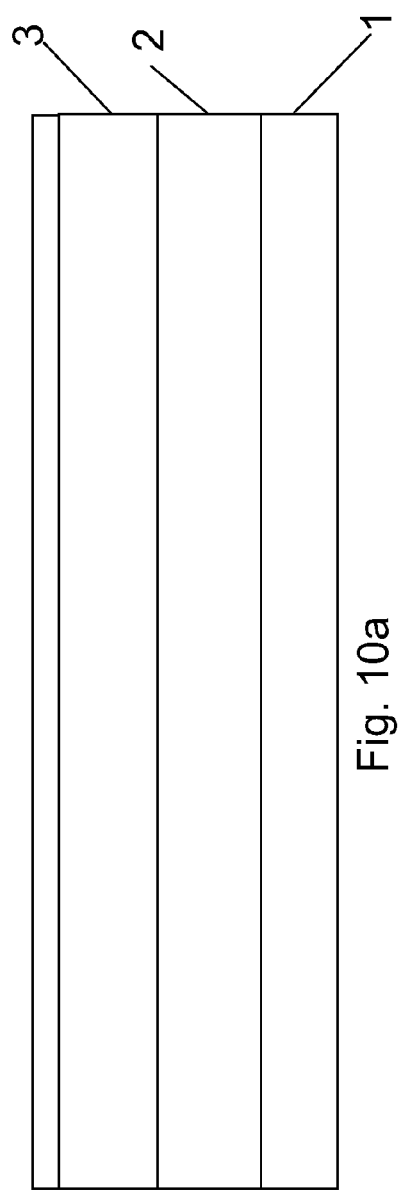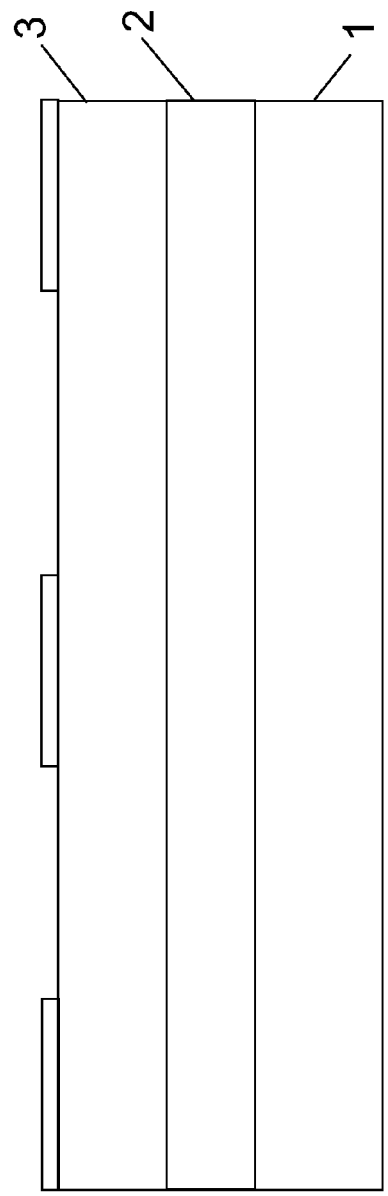

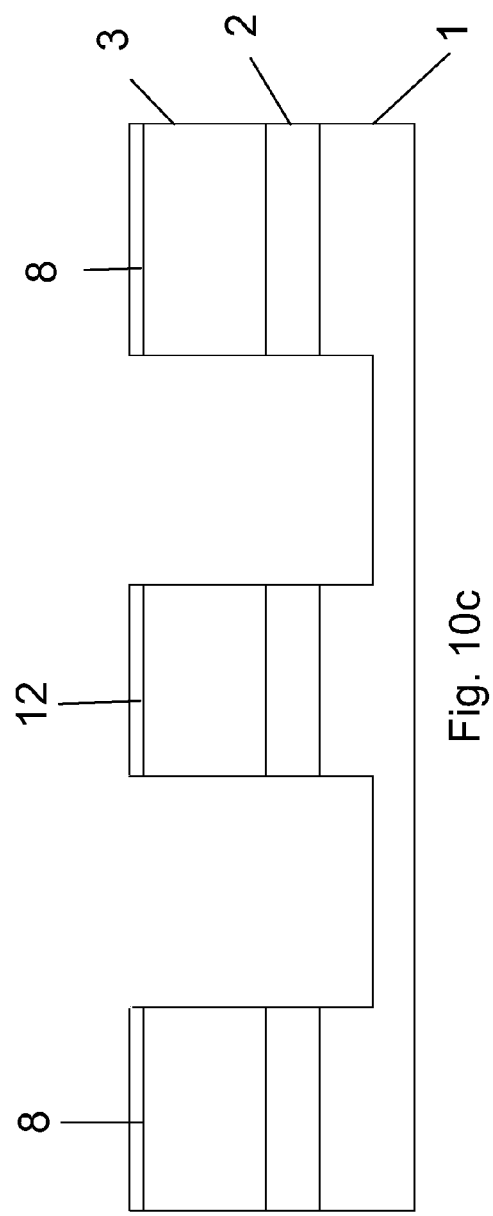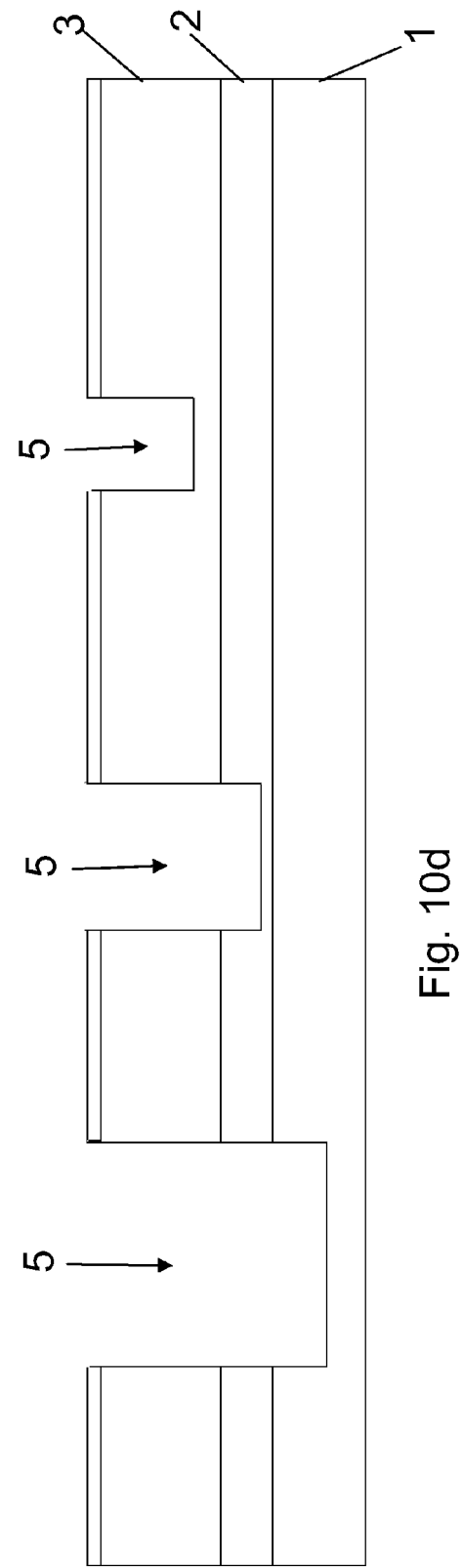

US 9,217,827 B2

OPTICAL WAVEGUIDE ARRANGEMENTS COMPRISING AN AUXILIARY WAVEGUIDE-LIKE STRUCTURE

RELATED APPLICATIONS

This application is a 35 U.S.C. 371 national stage filing of International Application No. PCT/GB2011/052192, filed on Nov. 11, 2011, which claims priority to United Kingdom Patent Application No. 1020351.1, filed on Dec. 1, 2010. The contents of the aforementioned applications are hereby incorporated by reference.

FIELD OF THE INVENTION

The present invention relates to optical waveguide arrangements and is more particularly, but not exclusively, concerned with optical waveguide arrangements for multimode interference (MMI) couplers.

BACKGROUND OF THE INVENTION

In the field of optical telecommunication, optical couplers (e.g. MMI couplers) are commonly used as the optical splitters and recombiners in optical circuits such as Mach-Zehnder modulators (MZMs). Normally input and output waveguides are provided for guiding optical signals through the couplers.

FIG. 1a is a schematic illustration of a 2×2 MMI coupler in plan view. As is well known, for a specific design of MMI the MMI length and waveguide pitch (centre-to-centre spacing) of the input 12 and output waveguides 4 are necessarily related to the width of the MMI.

FIG. 1b is a schematic illustration of an idealised input/output ridge waveguide of a 2×2 MMI coupler shown in vertical cross-section. This idealised rectangular waveguide ridge profile is generally not practically achievable at reduced ridge dimensions The input waveguides 12 are formed on a semiconductor substrate comprising a lower confinement (cladding) layer 1, a waveguide core layer 2 deposited on the lower confinement layer 1 and an upper confinement (cladding) layer 3 deposited on the waveguide core layer 2. One or more of these layers is selectively etched, over predetermined widths, W, to define ridges which form the waveguides 12. The etching process also defines an etched gap 5 between two waveguides 12, which controls the profile of the waveguide structure.

In an optical circuit it is advantageous to miniaturize the size of the MMI in order to provide a more compact circuit. In order to reduce the length of the MMI shown in FIG. 1a, it is therefore necessary also to reduce the MMI width and also the gap 5 between the input/output waveguides, by reducing their spacing, S, shown in FIG. 1a. It has been demonstrated in many commonly used semiconductor etch processes, that the etched depth of the waveguide 12 is dependent on the etched gap 5 and also that the slope of the waveguide sidewall is not vertical, particularly at the base of the waveguide, and also depends upon the etched depth.

FIG. 1c shows schematically the variation of the etched depth as a function of the etched gap for the waveguides 12 shown in FIG. 1b. The etched depth of the waveguides 12 is shallower if the etching process produces a smaller etched gap 5. In such an arrangement, there is a risk that the etched depth does not fully penetrate through the waveguide core layer 2, for closely spaced waveguides.

FIG. 1d is a schematic cross-section of a pair of input ridge waveguides of a 2×2 MMI coupler in which the ridge etch depth is dependent upon the waveguide gap. As can be seen, the ridge profile is asymmetric and an inside wall 6 of each waveguide 12 is not vertical. The waveguides 12 are therefore individually left-right asymmetric. One of the effects of such an asymmetrical arrangement is polarisation rotation. In this case, the state of polarisation of the light propagating in each of the two input waveguides is rotated in opposite directions, and so will become unequal between the two waveguides. The disadvantage of this, for example, in the case that the 2×2 MMI is used as a recombiner in an MZ interferometer, is that the light from the two input waveguides will not interfere completely, leading to a degradation of the extinction ratio of the interferometer.

Furthermore, waveguides which do not have substantially the same profile/shape (at the input and output of the MMI) can lead to degradation of the performance of the coupler. In particular, the required imaging of the input optical modes to the desired output optical modes, which is achieved by means of the multi-mode optical interference behaviour of the coupler, is impaired if either the input or output waveguides are incorrectly positioned or are not matched. This impairment may take the form of increased optical loss (reduction in optical power), or in errors in the relative optical power or in the relative optical phase between the signals at each of the MMI waveguide outputs. In addition, when the input/output waveguides do not have the same ridge profile over a significant length leading to the MMI, their propagation characteristics are different. This could lead to imbalance in a MZ interferometer in which the waveguides are contained.

A possible solution to the polarisation rotation is to etch the waveguides to a deeper depth so as to ensure a vertical sidewall at the waveguide-core for closely-spaced waveguides. However, this solution is not possible in many practical cases, because of an upper limit for the maximum waveguide etched depth for widely spaced waveguides which may arise from other optical circuit design considerations.

Thus there is a need for a waveguide arrangement design which will address the disadvantages associated with etch-process induced asymmetries in the shape of closely spaced waveguides.

SUMMARY OF THE INVENTION

It is one of the objects of the present invention to provide a simple design for such a waveguide arrangement to reduce the disadvantages associated with etch-process induced asymmetries in the shape of closely spaced waveguides.

According to one aspect of the invention there is provided an optical waveguide arrangement comprising an active ridge waveguide structure formed by etching of a substrate, and an auxiliary waveguide-like structure formed on the substrate adjacent to the waveguide structure to control the etched profile over the cross-section of the active waveguide structure. The substrate may be a semiconductor substrate.

Such an arrangement reduces the disadvantageous effects (e.g. polarisation rotation) caused by the waveguides having asymmetric transverse cross-sections. The arrangement helps to ensure that all input/output waveguides to the MMI have substantially the same ridge profile and are individually symmetric (left-right mirror symmetry).

The auxiliary structure may be arranged on the substrate to impart a symmetric active waveguide profile. Conveniently the auxiliary structure is arranged on the substrate to produce symmetric ridges in the active waveguide structure.

The use of the auxiliary waveguide structures provides a more symmetric etched ridge waveguide profile. This can be achieved by etching the active waveguides and the auxiliary waveguides in close proximity to each other. The use of the symmetric waveguides at an input and an output of the MMI coupler ensures that the optical modes are correctly aligned when the optical signal launches into and exits the MMI coupler. This arrangement thereby improves the performance of the MMI coupler.

Alternatively or additionally the auxiliary structure may be arranged on the substrate to control the etched profile along the length of the active waveguide structure. Preferably the auxiliary structure is arranged to control the etched profile by variation of a gap between the active waveguide structure and the auxiliary structure. Conveniently the auxiliary structure is arranged to vary the etched profile to produce a transition between a strongly guided active waveguide and a weakly guided active waveguide.

This arrangement ensures that the above transition is smooth and is carried out within the same processing step.

According to another aspect of the present invention there is provided a method of manufacturing an optical waveguide arrangement comprising:
   forming an active ridge waveguide structure by etching of a substrate, and
   controlling the etched profile along the cross-section of the active waveguide structure by forming an auxiliary waveguide-like structure on the substrate adjacent the active waveguide structure.

BRIEF DESCRIPTION OF THE DRAWINGS

In order that the invention may be more fully understood, a number of embodiments of the invention will now be described, by way of example, with reference to the accompanying drawings, in which:

FIG. 8a is a plan view of a strong-to-weak waveguide coupler having auxiliary balancing waveguides adjacent to the active waveguide to control the waveguide ridge profile along its length;

FIG. 8b shows the strong-to-weak waveguide coupler of FIG. 8a in schematic cross-section along four planes;

FIG. 10a to FIG. 10d show the manufacturing steps of the active and auxiliary waveguides used in a waveguide arrangement for an optical coupler.

DETAILED DESCRIPTION OF PREFERRED EMBODIMENTS

Figure 1A:
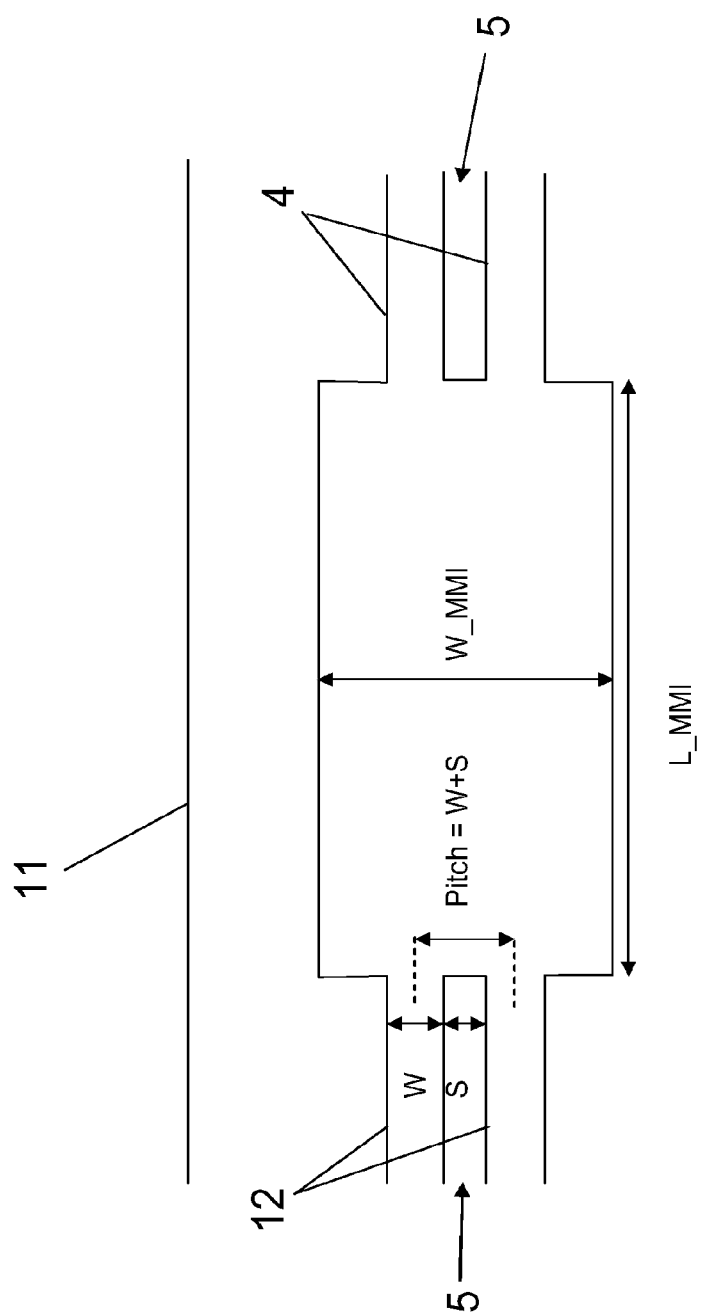
FIG. 1a is a schematic illustration of a 2×2 MMI coupler in plan view.
Figure 1B:
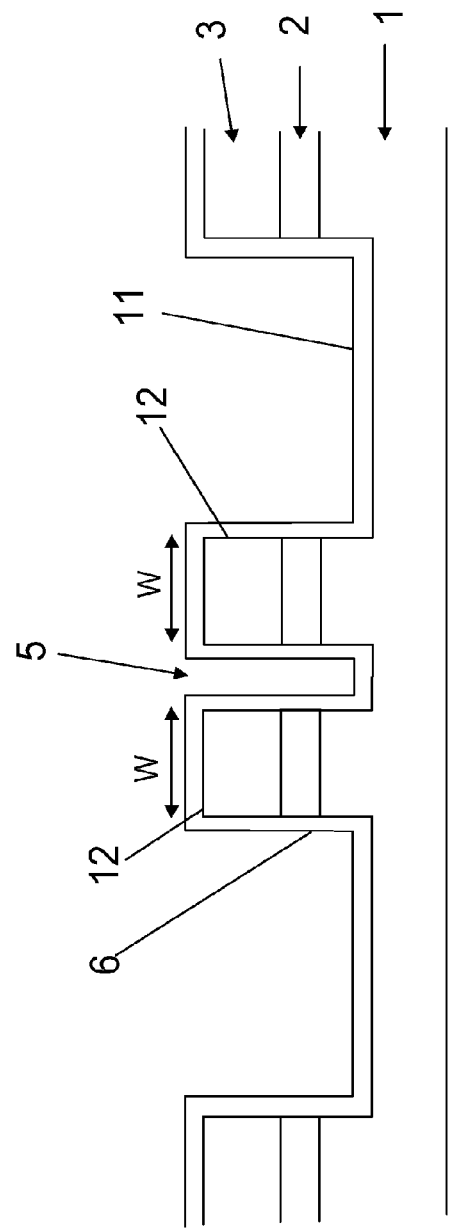
FIG. 1b is a schematic illustration of a known input/output ridge waveguide of a 2×2 MMI coupler.
Figure 1C:
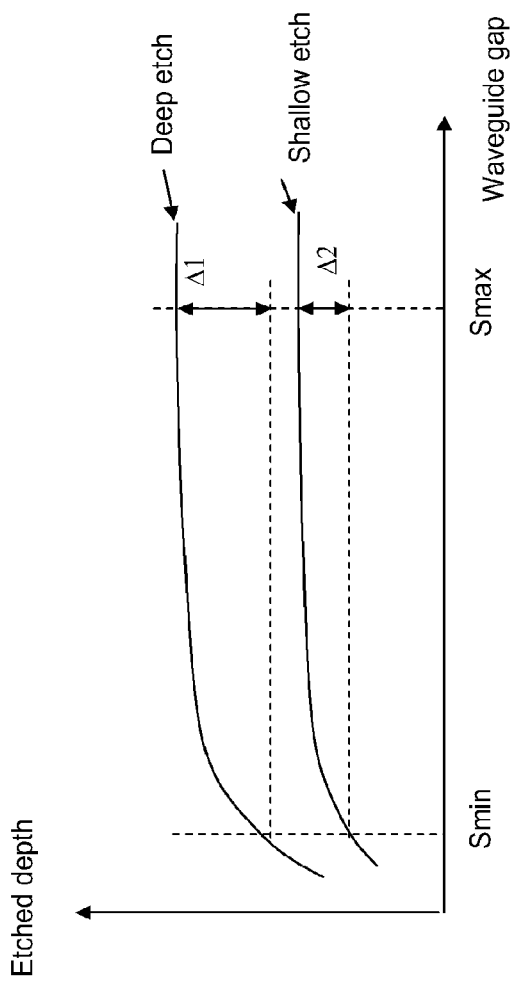
FIG. 1c shows the variation of the etched depth as a function of the etched gap for commonly-used semiconductor etch processes, for the waveguides shown in FIGS. 1a and 1b
Figure 1D:
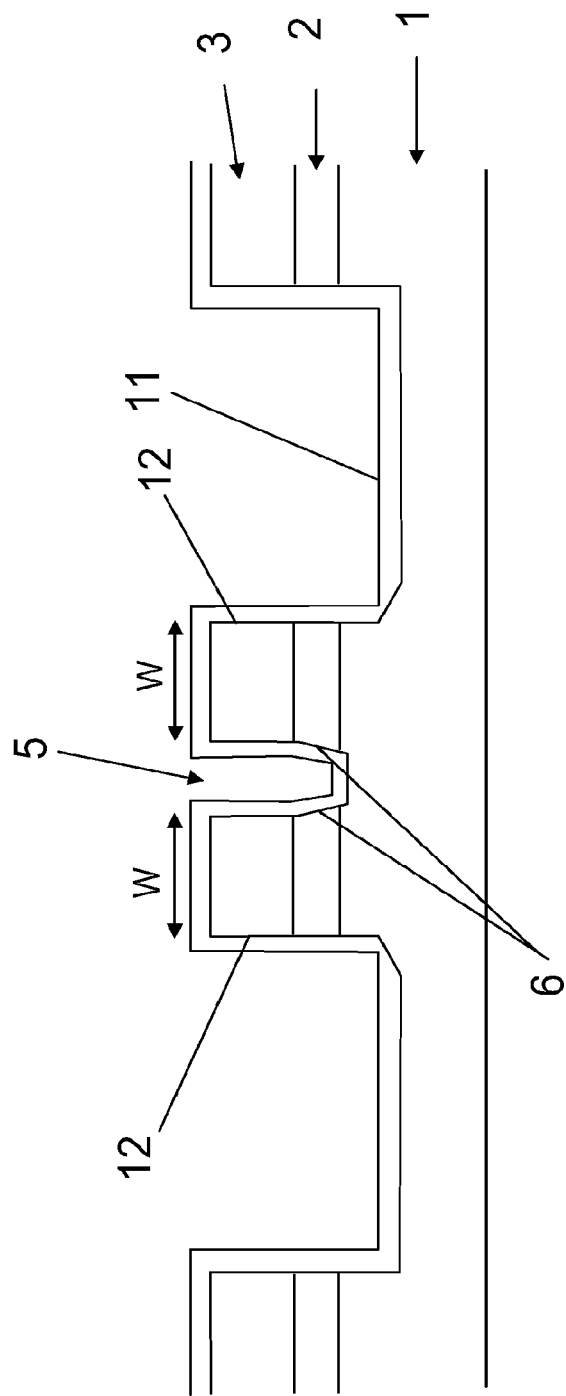
FIG. 1d is a schematic illustration of a closely spaced input/output ridge waveguide of a 2×2 MMI coupler with etched waveguide depth and sidewall slope dependent upon the spacing between the adjacent waveguides.
Figure 2:
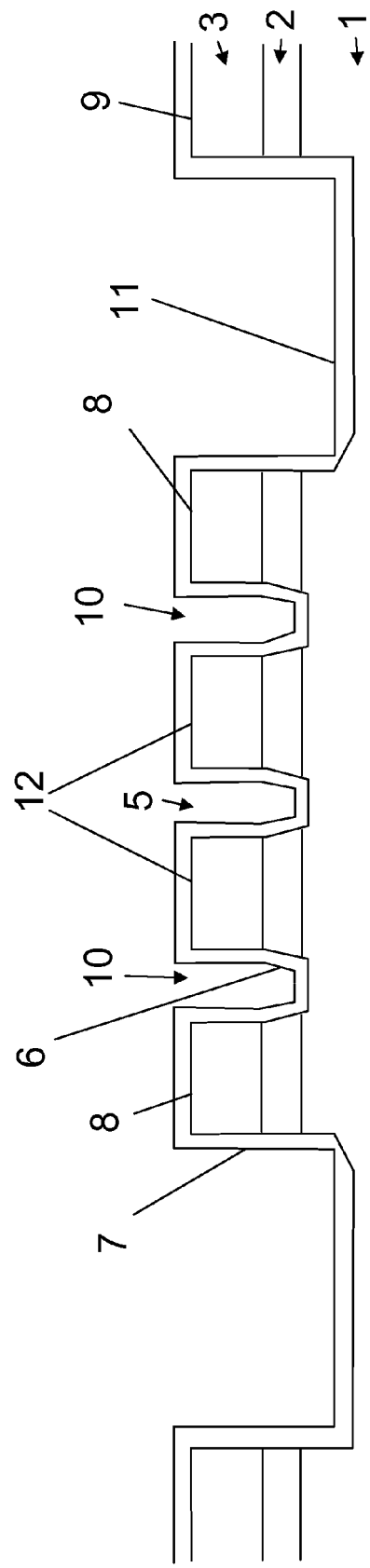
FIG. 2 is a schematic illustration of an input/output ridge waveguide used in a 2×2 MMI coupler having additional outer auxiliary balancing waveguides with identical spacing.

FIG. 2 is a schematic illustration of an input/output ridge waveguide used in a 2×2 MMI coupler. Many features of the arrangement of FIG. 2 are similar to those of the arrangements of FIGS. 1b and 1d. The arrangement of FIG. 2 also includes the outer auxiliary balancing waveguides 8. The purpose of these auxiliary waveguides is to provide a symmetric profile for the two inner waveguides. These auxiliary waveguides do not contain any optical signal in the operation of the optical circuit. In this embodiment, the auxiliary waveguides 8 are spaced identically from the active waveguide 12. The etched gap 5 between two active waveguides 12 is the same as the etched gap 10 between the auxiliary waveguide 8 and the active waveguide 12, which produces symmetric ridges. The channel width 11 between the active waveguides 12, along with the auxiliary waveguides 8, to an adjacent etched element is about 10 μm. In one embodiment, the maximum etched gap 10 between an auxiliary waveguide 8 and its associated active waveguide 12 is also about 10 μm as the effect of the waveguide spacing on the waveguide etched depth becomes negligible for a greater spacing than about 10 μm. Though it could of course be larger or smaller depending upon the exact form of the variation of etched depth with waveguide spacing shown in FIG. 1c.

As can be seen from FIG. 2, the use of the auxiliary waveguides provides symmetric ridges but there is still a risk of non-vertical ridge side walls 6. The inventors have appreciated that this issue can be addressed during the etching process by defining larger etched gaps 5, 10 to provide deeply etched trenches. However, this may limit the degree of miniaturisation which can be achieved for the MMI dimensions. Alternatively, the overall etched depth can be increased, but this needs to be consistent with any design upper limit that there may be on the etched depth for widely separated waveguide regions (such as the channel region 11). In order to do so, a two-stage etching technique may be employed. In this technique, an initial short etch (localised pre-etch) prior to the main waveguide etch is performed to the regions where closely spaced waveguides are to be subsequently defined. As a result, the depth of these closely spaced waveguides is increased so as to reduce the difference in the etched depth with the widely separated waveguides (such as the channel region).

The variation of the etched depth as a function of the etched gap for the waveguides of FIG. 2 is also shown in FIG. 1c. The etched depth depends on the spacing between the waveguides. Within an optical circuit, this waveguide spacing can vary between a minimum and maximum value, denoted by Smin and Smax in FIG. 1c. The etched depth varies by an amount Δ over this range of spacing. This variation in depth will depend upon the total etched depth. FIG. 1c shows the case of a deep and shallow etched depth, having etch-depth variations of Δ1 and Δ2 respectively, where Δ2 is less than Δ1. For miniaturisation of the optical circuit, it is desirable that the minimum gap Smin be made as small as possible. The minimum useable waveguide gap has an etched depth which has sufficiently penetrated through the waveguide core so as to provide optical confinement for light within that waveguide (as shown in the arrangement of FIG. 2). The inventors have further appreciated that, in order to further reduce this minimum gap dimension, the variation in etched-depth versus gap, 'Δ', needs to be reduced. This is a characteristic of the actual process used to perform the etching. Alternatively, 'Δ' may be reduced by using a thinner upper confinement (cladding) layer 3, to allow a shallower etched depth to be used and which is still able to penetrate through the core layer.

Figure 3:
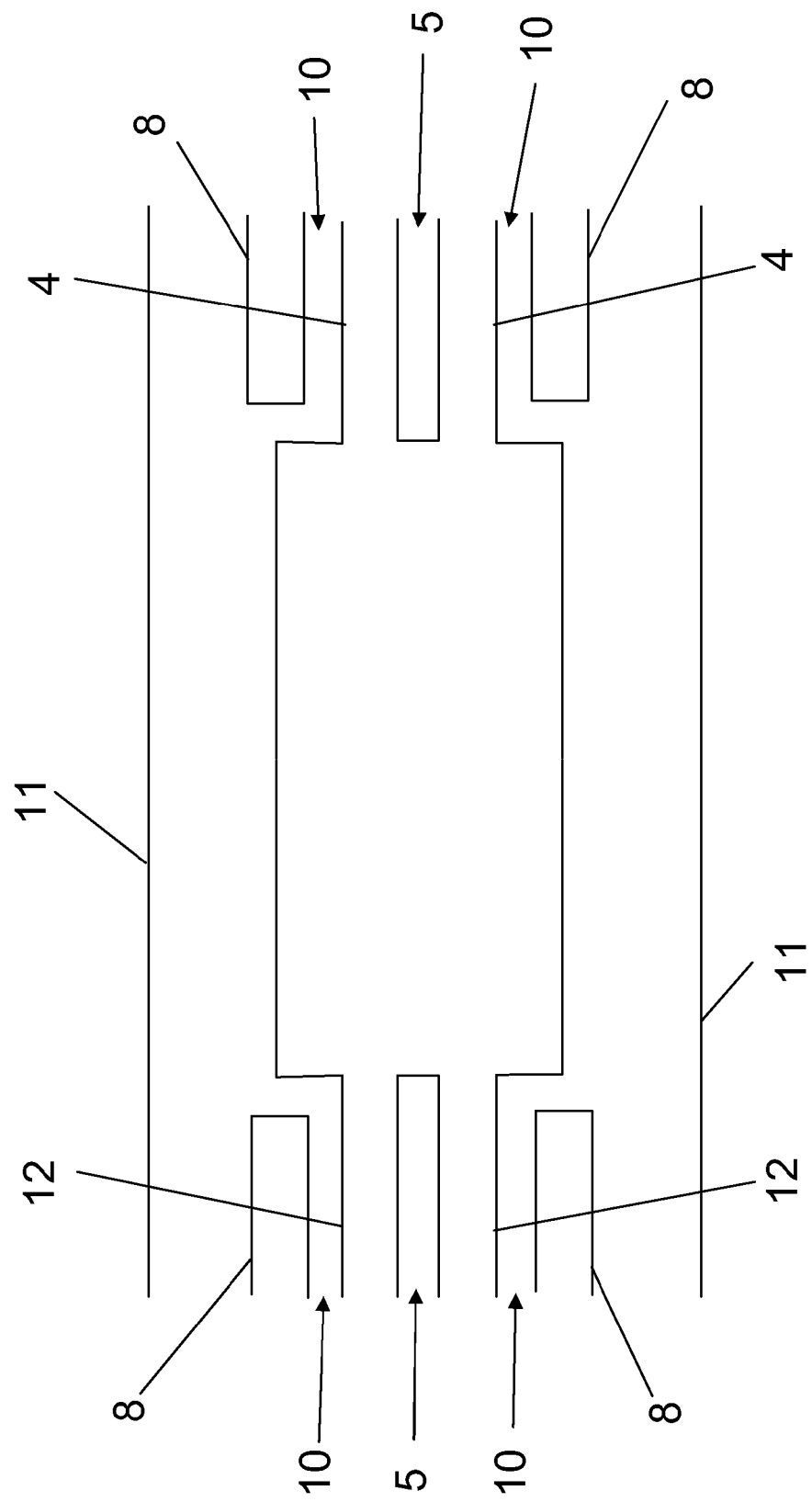
FIG. 3 is a plan view of a 2×2 MMI coupler showing the auxiliary balanced input and output waveguides.

FIG. 3 is a plan view of a 2×2 MMI coupler in which the balanced input waveguides 12 and the balanced output waveguides 4 are shown. Both the input and output waveguides 12, 4 are balanced by the virtue of the auxiliary waveguides 8

Figure 4B:
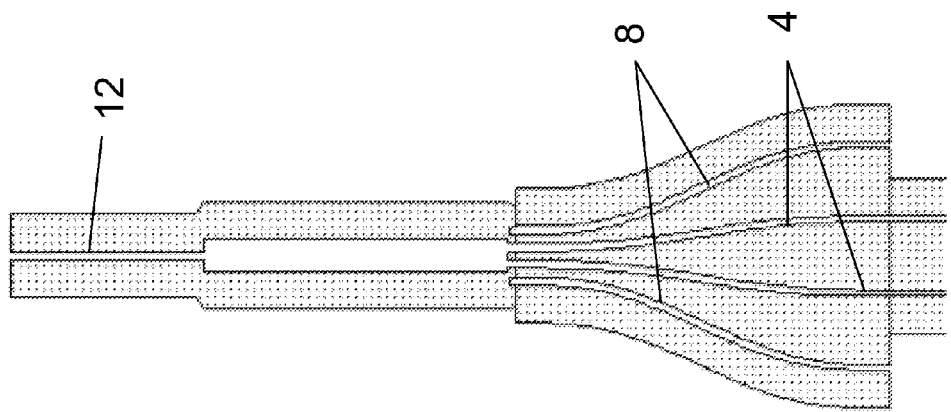
FIG. 4b is a plan view of a 1×2 MMI coupler having a standard input waveguide and auxiliary balanced output waveguides.
Figure 4A:
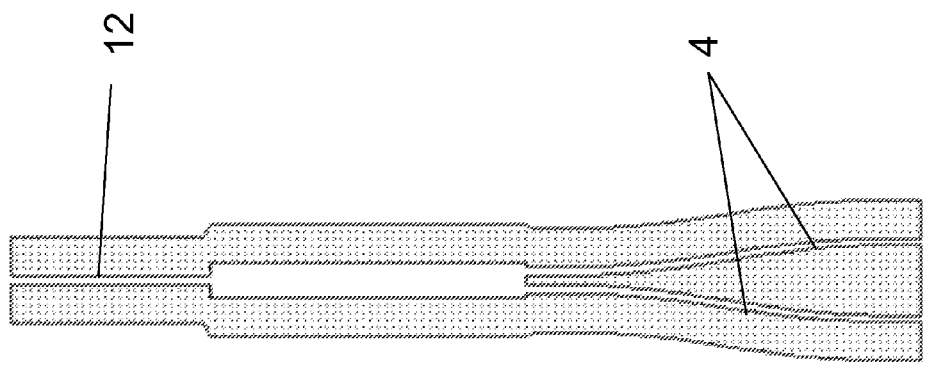
FIG. 4a is a plan view of a 1×2 MMI coupler having standard input and output waveguides.

FIG. 4a is a plan view of a 1×2 MMI coupler having a standard input waveguide 12 and standard output waveguides 4. FIG. 4b is a plan view of a 1×2 MMI coupler having a standard input waveguide 12 and balanced or symmetric output waveguides 4. The output waveguides 4 are balanced because the auxiliary waveguides 8 are provided adjacent to the output waveguides 4.

Figure 5B:
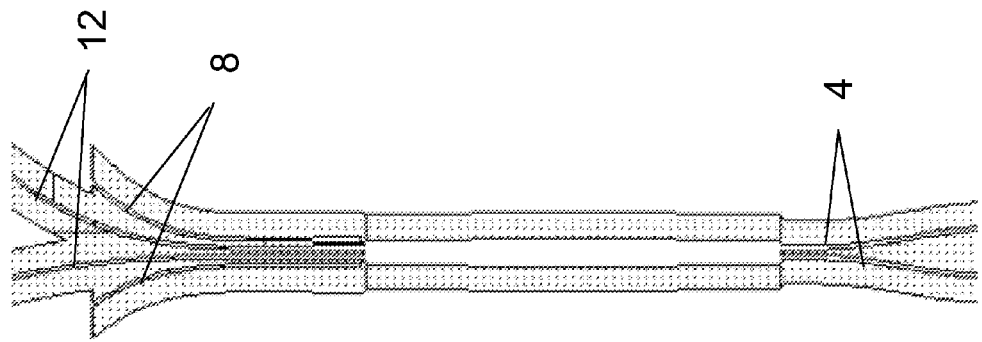
FIG. 5b is a plan view of a 2×2 MMI coupler having auxiliary balanced or symmetric input waveguides and standard output waveguides.
Figure 5A:
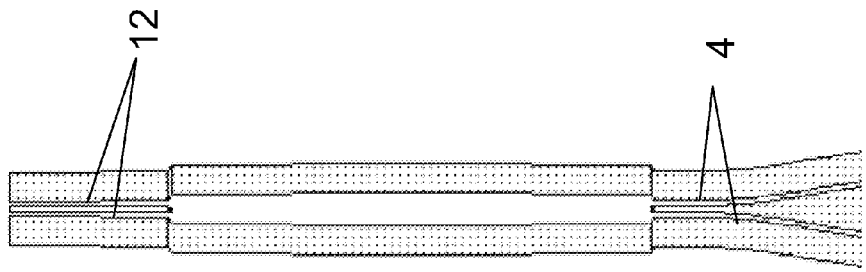
FIG. 5a is a plan view of a 2×2 MMI coupler shown in FIG. 1 having two standard input and output waveguides.

FIG. 5a is a plan view of a 2×2 MMI coupler having two standard input waveguides 12 and two standard output waveguides 4. This figure shows a partial arrangement of the standard input waveguide 12 but the complete arrangement of the standard output waveguides 4. FIG. 5b is a plan view of a 2×2 MMI coupler having balanced or symmetric input waveguides 12 and standard non balanced output waveguides 4. Similarly to the arrangements shown in FIGS. 4b, the input waveguides 12 are balanced by arranging the auxiliary waveguides 8 adjacent to the input waveguides 12.

Figure 6B:
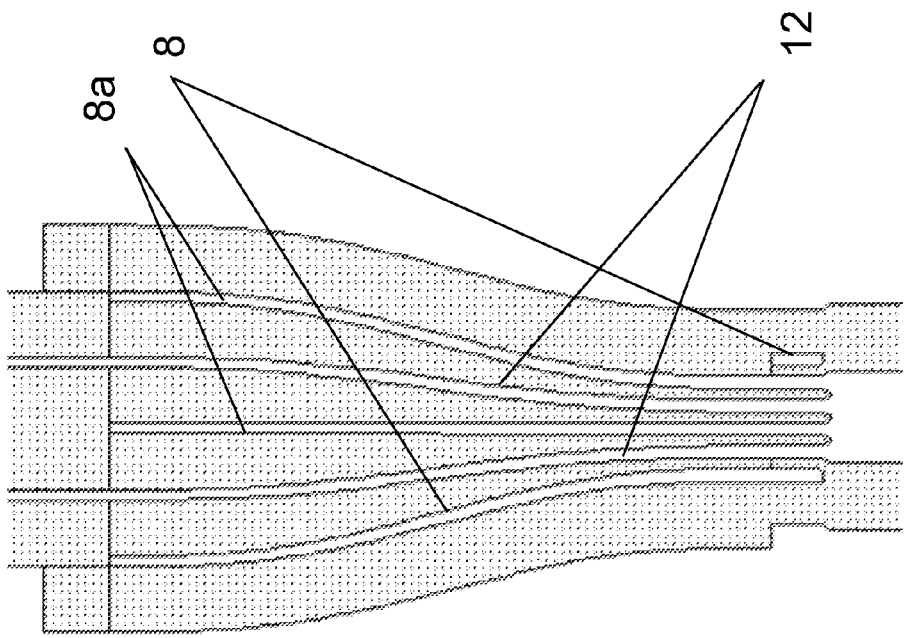
FIG. 6b is a plan view of the input waveguides to a 4×4 MMI coupler having additional auxiliary balanced or symmetric input waveguides in a configuration in which two of the four waveguides are actively used.
Figure 6A:
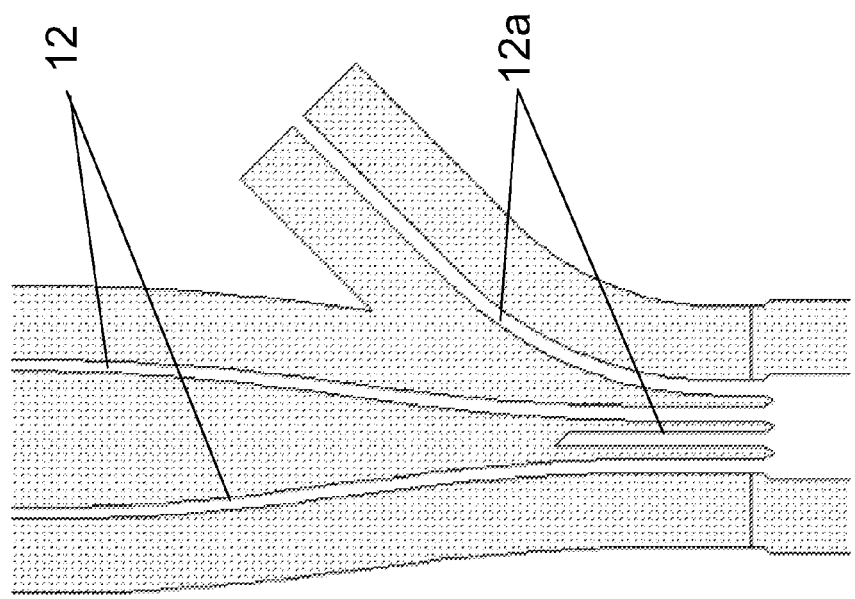
FIG. 6a is a plan view of input waveguides to a 4×4 MMI coupler having standard input waveguides arranged in a configuration in which only two of the four waveguides are actively used.

FIG. 6a is a plan view of the input to a 4×4 MMI coupler having two active input waveguides 12 and two inactive (terminated) input waveguides, labelled 12a. FIG. 6b is a plan view of the input to a 4×4 MMI coupler having balanced or symmetric input waveguides 12. Similarly to the arrangements shown in FIGS. 3b, 4b and 5b, the input waveguides 12 are balanced by providing the auxiliary waveguides 8 and 8a adjacent to the active input waveguides 12. In this case the unused waveguides have been adapted for the function in this invention of an auxiliary waveguide 8a.

Figure 7B:
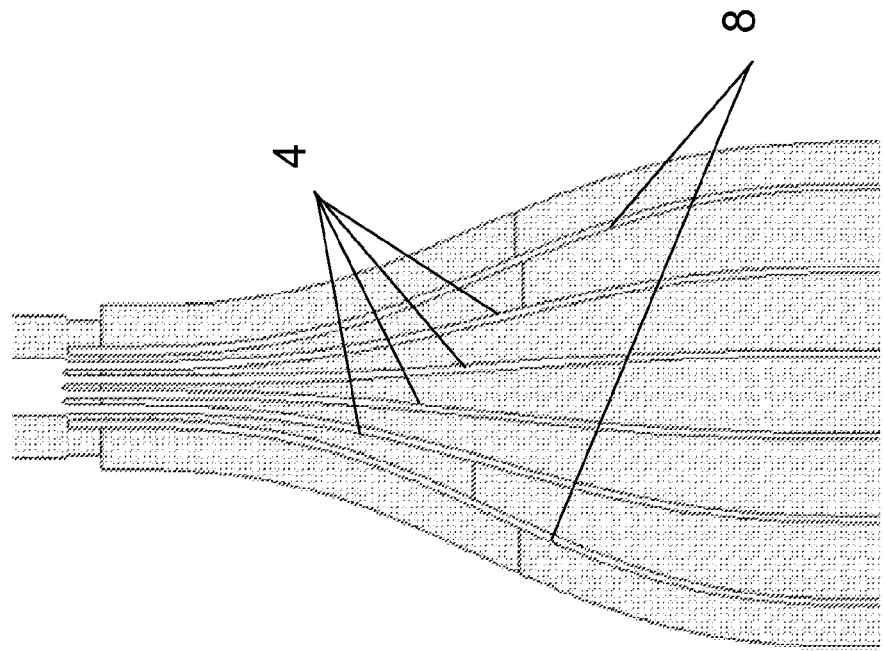
FIG. 7b is a plan view of the output waveguides to a 4×4 MMI coupler having auxiliary balanced or symmetric output waveguides.
Figure 7A:
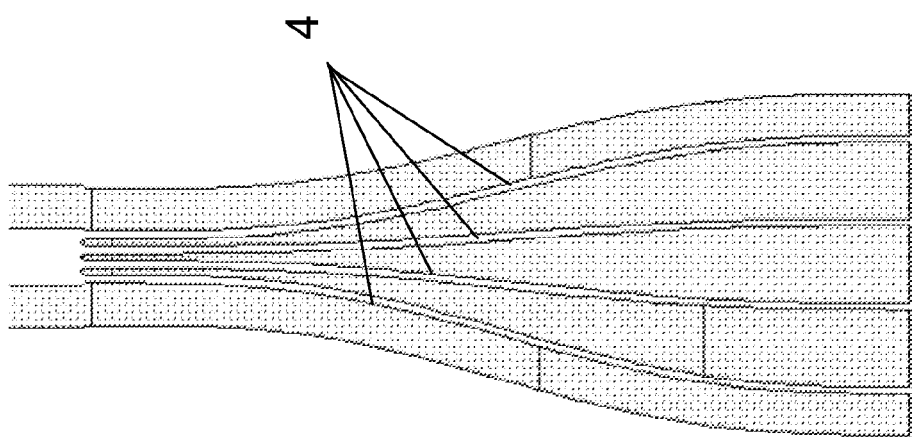
FIG. 7a is a plan view of the output waveguides to a 4×4 MMI coupler having four standard output waveguides.

FIG. 7a is a plan view of the output waveguides of a 4×4 MMI coupler having four standard output waveguides 4. FIG. 7b is a plan view of the output of a 4×4 MMI coupler having balanced or symmetric output waveguides 4. The output waveguides 4 are balanced by arranging the auxiliary waveguides 8 adjacent to the output waveguides 4.

It will be appreciated to those skilled in the art that it is necessary to form a transition between strongly and weakly guide waveguides. In one embodiment, the arrangement of the auxiliary balancing waveguides adjacent to the active input/output waveguides controls the etched profile of the active input/output waveguides along their length. On this basis, a smooth transition from a weakly guided waveguide to a strongly guided waveguide or vice versa can be achieved by variation of the etched gap between the active input/output waveguide and the auxiliary waveguide. A closer etched gap produces a weakly guided active waveguide having a shallower etched depth, which does not penetrate the waveguide core layer. By contrast, a larger etched gap produces a deeply etched trench to result in a strongly guided active waveguide. The deeply etched trench extends through the upper confinement layer, the waveguide core layer and partially through the lower confinement layer. This variation of the etched gaps can be controlled along the length of the waveguides within the same processing step.

FIG. 8a is a plan view of a waveguide element which forms a transition from a strong to weakly-guided waveguide having auxiliary balancing waveguides 8 adjacent to an input active waveguide 12. The etched gaps between the auxiliary and input waveguides are varied along the length of the waveguides to produce a transition from a strongly guided active waveguide to a weakly guided active waveguide. Similar arrangements are also possible for a transition from a weak to a strongly-guided active waveguide.

FIG. 8b shows the strong-to-weak waveguide transition of FIG. 8a in schematic cross-section along four vertical cross-sectional planes. The variation of the etched gap to produce the transition from a strongly guided waveguide to a weakly guided waveguide can be realised from this figure. For example, at plane A-A', the etched gap 10 between the active waveguide 12 and the auxiliary waveguide 8 is large enough to produce a deeply etched trench extending through the upper confinement layer 3, the waveguide core layer 2 and partially through the lower confinement layer 1. As a result the active waveguide 12 at plane A-A' has the effect of a strongly guided waveguide. The etched gap 10 is then reduced along the length of the waveguides at planes B-B', C-C' and D-D'. As seen, the etched depth of the active waveguide 12 at plane D-D' extends only through the upper confinement layer 3. The active waveguide 12 at plane D-D' therefore has the effect of a weakly guided waveguide. This clearly demonstrates that the variation of the etched gap along the length of the waveguides can result in the transition from the strongly guided waveguide to the weakly guided waveguide.

One possible application of this transition to a weakly guided waveguide is to act as a mode-filter, in which any higher-order modes which may propagate within the strongly-guided waveguide become unconfined within the weakly-guided waveguide, and so do not propagate over any significant distance within the weakly-guided waveguide.

Figure 9:
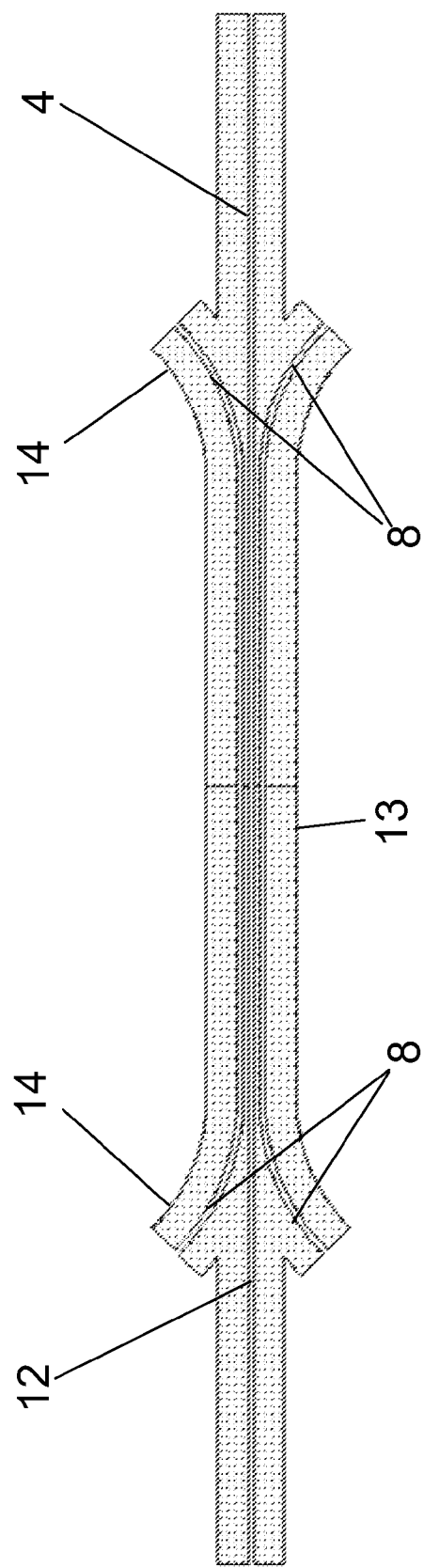
FIG. 9 is a plan view of an strong-to-weak waveguide coupler used as a mode filter.

FIG. 9 is a plan view of a transition from a strongly-guided waveguide to a weakly-guided waveguide and back to a strongly-guided waveguide which may be used as a mode filter having the auxiliary waveguides 8 adjacent to the input waveguide 12 and the output active waveguide 4. The etched gaps between the active waveguide 4, 12 and the auxiliary waveguides 8 are varied along the length of the waveguides as shown for the arrangements of FIGS. 8a and 8b. This mode filter configuration results in a transition of a weakly guided waveguide section 13 between two strongly guided waveguide sections 14. The weakly guided section 13 normally supports fewer higher order modes than those of the strongly guided section 14.

It will be appreciated that there are other possible applications of auxiliary waveguides. For example, a single auxiliary waveguide alongside an active waveguide could be used to form an asymmetric waveguide profile deliberately. Such asymmetric waveguides may be used to generate polarisation rotation.

In an exemplary embodiment, FIG. 10a to FIG. 10d show manufacturing steps S1 to S4 of the active and auxiliary waveguides, for the transition from the strongly guided waveguide to the weakly guided waveguide, using a dry etch technique.

S1: Depositing a dielectric etch mask on a top surface of a semiconductor substrate comprising the upper confinement layer 3, the waveguide core layer 2 and the lower confinement layer 1, as shown in FIG. 10a.

S2: Defining a dielectric etch mask on the top surface of the semiconductor substrate by standard photolithography and the dielectric etch process, as shown in FIG. 10b.

S3: Deeply etching the semiconductor substrate (by the dry etch process) so that the etched trench extends through the upper confinement layer 3, the waveguide core layer 2 and partially through the lower confinement layer 1, as shown in FIG. 10c. This results in a symmetric active waveguide profile.

S4: Varying the etched gap 5 between two waveguides along their length and at the same time using the same dry etch technique, as shown in FIG. 10d. This produces the transition from the strongly guided waveguide to the weakly guided waveguide or vice versa.

It will be appreciated that the etched depth of an isolated active waveguide (the active waveguide without accompanying auxiliary waveguides) can also be controlled along its length within the same dry etched processing step by adjusting the width or the gap of its adjacent etch channel. In such an arrangement, as the channel width or the gap is reduced, there will be a transition from a strongly guided waveguide (deeply etched) to a slab waveguide.

It will be noted that the foregoing description is directed to arrangements having ridge waveguides. However, it will be appreciated that the same principles may be applied to the other arrangements, such as those having buried ridge waveguides, for example.

It will be further noted that the foregoing description is generally directed to arrangements having semiconductor waveguides. However, it will be appreciated that other arrangements may be also possible in which the waveguides may be manufactured using other materials including dielectric material such as silica, for example.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A multimode interference (MMI) coupler comprising an optical waveguide arrangement comprising:
    an active ridge waveguide structure formed by etching of a substrate;
    an auxiliary waveguide-like structure formed on the substrate adjacent to the active waveguide structure to control the etched profile over the cross-section of the active waveguide structure; and
    an MMI region coupled with the active ridge waveguide structure,
    wherein the active waveguide structure comprises an input active waveguide and/or an output active waveguide and the MMI region is coupled with the input active waveguide and/or the output active waveguide, the auxiliary structure being arranged adjacent at least one of the input and output active waveguides, and
    wherein the active waveguide structure comprises two active waveguides, and the auxiliary structure is arranged such that a gap between the active waveguides is about the same as a gap between each active waveguide and a corresponding auxiliary waveguide in the auxiliary structure, and the gaps are defined such that an etched trench extends through at least a waveguide core layer of the substrate so as to provide a strong optical confinement for light within the active waveguide.

2. The MMI coupler of claim 1, wherein the auxiliary structure is arranged on the substrate to impart a symmetric active waveguide profile.

3. The MMI coupler of claim 1, wherein the active waveguide structure comprises one or more ridges and the auxiliary structure is arranged on the substrate so that each ridge in the active waveguide structure is symmetrical.

4. The MMI coupler of claim 1, wherein the active waveguide structure comprises two or more ridges and the auxiliary structure is arranged on the substrate so that each ridge in the active waveguide structure is substantially the same shape.

5. The MMI coupler of claim 1, wherein the maximum gap between the active waveguide and the corresponding auxiliary waveguide is about 10 μm.

6. The MMI coupler of claim 1, wherein the auxiliary structure is arranged on the substrate to control the etched profile along the length of the active waveguide structure.

7. The MMI coupler of claim 6, wherein the auxiliary structure is arranged to control the etched profile by variation of a gap between the active waveguide structure and the auxiliary structure.

8. The MMI coupler of claim 1, wherein the substrate is a semiconductor substrate.

9. An optical waveguide arrangement comprising:
    an active ridge waveguide structure formed by etching of a substrate; and
    an auxiliary waveguide-like structure formed on the substrate adjacent to the active waveguide structure to control the etched profile over the cross-section of the active waveguide structure,
    wherein the auxiliary structure is arranged on the substrate to control the etched profile along the length of the active waveguide structure,
    wherein the auxiliary structure is arranged to vary the etched profile to produce a transition between a strongly guided active waveguide and a weakly guided active waveguide, and
    wherein the etched profile of the weakly guided active waveguide comprises a shallowly etched trench extending through an upper confinement layer of the substrate, and the etched profile of the strongly guided active waveguide comprises a deeply etched trench extending through an upper confinement layer, a waveguide core layer and partially through a lower confinement layer of the substrate.

10. A method of manufacturing a multimode interference (MMI) coupler, the method comprising:
    forming an active ridge waveguide structure by etching of a semiconductor substrate;
    forming an MMI region coupled with the active ridge waveguide structure; and controlling the etched profile along the cross-section of the active waveguide structure by forming an auxiliary waveguide-like structure on the substrate adjacent the active waveguide structure, wherein the active waveguide structure comprises an input active waveguide and/or an output active waveguide and the MMI region is coupled with the input active waveguide and/or the output active waveguide, the auxiliary structure being arranged adjacent at least one of the input and output active waveguides, and wherein the active waveguide structure comprises two active waveguides, and the auxiliary structure is arranged such that a gap between the active waveguides is about the same as a gap between each active waveguide and a corresponding auxiliary waveguide in the auxiliary structure, and the gaps are defined such that an etched trench extends through at least a waveguide core layer of the substrate so as to provide a strong optical confinement for light within the active waveguide.

11. The method of claim 10, further comprising:

controlling the etched profile by providing symmetric ridges in the active waveguide structure.

12. The method of claim 10, further comprising:

controlling the etched profile along the length of the active waveguide structure by varying the gap between the active waveguide structure and the auxiliary structure.

13. The method according to claim 10, wherein the etched profile is produced by a dry etching technique.

* * * * *